US012543607B2

(12) United States Patent
Bayless et al.

(10) Patent No.: US 12,543,607 B2
(45) Date of Patent: Feb. 3, 2026

(54) SEPARATION METHOD AND ASSEMBLY FOR CHIP-ON-WAFER PROCESSING (71) Applicant: Micron Technology, Inc., Boise, ID (US)

(72) Inventors: Andrew M. Bayless, Boise, ID (US); Bradley R. Bitz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/310,481

(22) Filed: May 1, 2023

(65) Prior Publication Data

US 2023/0268334 A1  Aug. 24, 2023

Related U.S. Application Data (62) Division of application No. 16/898,180, filed on Jun. 10, 2020, now Pat. No. 11,676,955.

(51) Int. Cl.
| | |
|---|---|
| *H01L 25/065* | (2023.01) |
| *H01L 21/70* | (2006.01) |
| *H01L 21/78* | (2006.01) |
| *H01L 23/00* | (2006.01) |
| *H01L 25/00* | (2006.01) |
| *H10D 84/01* | (2025.01) |

(52) U.S. Cl.
CPC .............. *H01L 25/50* (2013.01); *H01L 21/70* (2013.01); *H01L 21/78* (2013.01); *H01L 24/29* (2013.01); *H01L 25/0652* (2013.01); *H10D 84/01* (2025.01)

(58) Field of Classification Search
CPC ......... H01L 25/50; H01L 21/70; H01L 21/78; H01L 21/82; H01L 25/0657
See application file for complete search history.

(56) References Cited

U.S. PATENT DOCUMENTS 5,904,548 A * 5/1999 Orcutt .................... H01L 21/78
                                                       438/460
6,495,914 B1  12/2002  Sekine et al.
6,743,699 B1   6/2004  Doan
(Continued)

FOREIGN PATENT DOCUMENTS

| CN | 1267396 A | 9/2000 |
| CN | 103718289 A | 4/2014 |
| CN | 110176403 A | 8/2019 |

OTHER PUBLICATIONS

CN Patent Application No. 202110589945.1—Chinese Office Action and Search Report, dated Sep. 27, 2024, with English Translation, 19 pages.

Primary Examiner — Phat X Cao
(74) Attorney, Agent, or Firm — Dorsey & Whitney LLP (57) ABSTRACT A method for separating semiconductor die stacks of a chip-on-wafer assembly is disclosed herein. In one example, divider walls are arranged in a pattern on a first surface of a device wafer such that regions between the divider walls define mounting sites. Die stacks are mounted to the device wafer, wherein individual die stacks are located at a corresponding mounting site between the divider walls. The device wafer is cut through from a second surface that is opposite the first surface of the device wafer, and the divider walls are removed from between the die stacks to form a vacant lane between adjacent die stacks.

14 Claims, 6 Drawing Sheets (56) References Cited

U.S. PATENT DOCUMENTS

| | | | |
|---|---|---|---|
| 6,908,784 B1 | 6/2005 | Farnworth et al. | |
| 7,982,279 B2* | 7/2011 | Kumagai | H01L 21/78 |
| | | | 257/276 |
| 9,346,671 B2 | 5/2016 | Magnus et al. | |
| 2003/0094666 A1* | 5/2003 | Clayton | H01L 23/49827 |
| | | | 257/459 |
| 2005/0111797 A1 | 5/2005 | Fisher et al. | |
| 2013/0026643 A1 | 1/2013 | England et al. | |
| 2014/0134798 A1* | 5/2014 | Kim | H01L 23/49816 |
| | | | 438/109 |
| 2017/0069535 A1* | 3/2017 | Masuko | H10D 30/015 |
| 2018/0033780 A1 | 2/2018 | Ma et al. | |
| 2020/0343108 A1* | 10/2020 | Jang | H01L 21/78 |
| 2021/0391316 A1 | 12/2021 | Bayless et al. | |

\* cited by examiner

SEPARATION METHOD AND ASSEMBLY FOR CHIP-ON-WAFER PROCESSING

CROSS-REFERENCE TO RELATED APPLICATION(S)

This application is a divisional of U.S. patent application Ser. No. 16/898,180, filed on Jun. 10, 2020, now U.S. Pat. No. 11,676,955, which is incorporated herein by reference in its entirety.

TECHNICAL FIELD

The present technology is directed to semiconductor device packaging. More particularly, some embodiments of the present technology relate to techniques for retaining die stacks in place to reduce damage to the die during dicing.

BACKGROUND

Semiconductor dies, including memory chips, microprocessor chips, logic chips and imager chips, are typically assembled by mounting a plurality of semiconductor dies, individually or in die stacks, on a substrate in a grid pattern. The mounted die stacks are then encased in a polymeric material (e.g., a resin) in a wafer-level molding process. As more dies are stacked together to increase capacity, the heights of the die stacks increase. This can cause the wafers to bow after the molding process, which in turn may cause the die stacks to shift positions so that they are not properly aligned for dicing. As a result, when the die stacks are separated using a rotary blade, chipping or cracking can occur along the edges of the dies.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Specific details of several embodiments for preventing wafer bow and dicing defects for chip-on-wafer (COW) packaging are described below. In one example, a method for separating semiconductor die stacks in a COW assembly comprises arranging divider walls in a pattern (e.g., a grid) on a first surface of a device wafer such that regions between the divider walls define mounting sites. The method also includes mounting individual die stacks at corresponding mounting sites such that individual die stacks are separated from each other by the divider walls. The die stacks can be spaced apart from the divider walls by a gap, and the divider walls can be the same height or taller than the die stacks. The die stacks and divider walls are then encased in a polymeric material that covers the die stacks and fills the gaps between the die stacks and the divider walls. The divider walls inhibit bowing of the device wafer and maintain the orientation of the die stacks. The die stacks are then separated from each other by etching or dissolving divider walls. For example, the divider walls can be made from a material that dissolves in water or another solvent such that a saw is not needed to dice the die stacks from each other. As a result, the COW is expected to have less, if any, damage to the die caused by dicing.

Figure 1A:
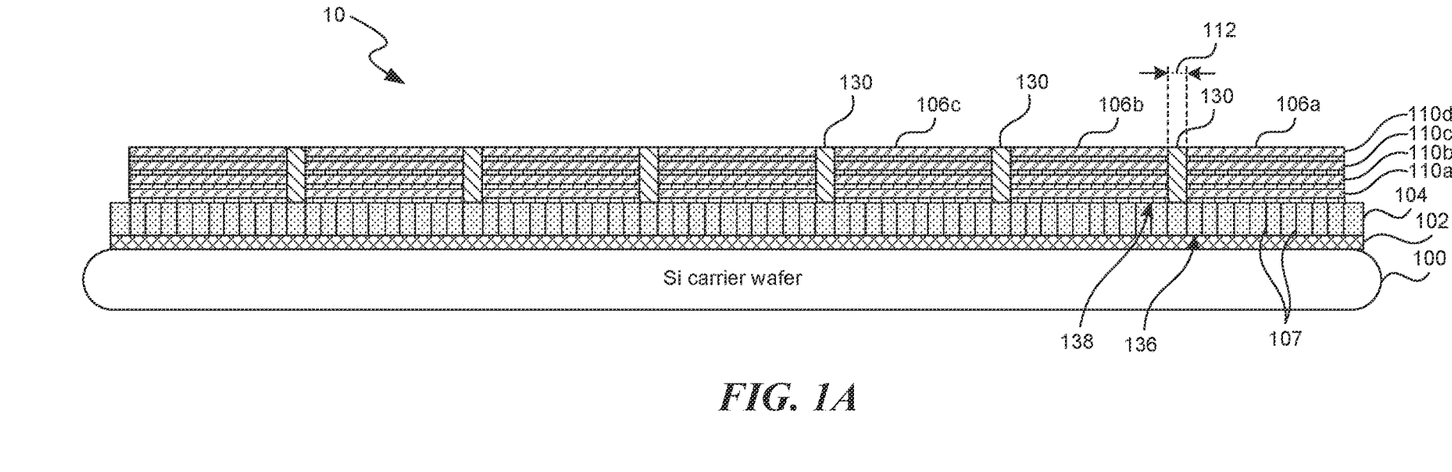
FIG. 1A is a cross-sectional view of die stacks attached to a device wafer with divider walls between the die stacks in a chip-on-wafer (COW) assembly in accordance with the present technology.

FIG. 1A is a cross-sectional view of COW assembly 10 having a device wafer 104, divider walls 130 arranged in a grid array on the device wafer 104, and die stacks 106 (identified individually as 106a, 106b and 106c) mounted on the device wafer 104 at mounting sites in the regions between the divider walls 130. In most applications, several hundred die stacks 106 are mounted on a device wafer 104 for packaging.

At this stage of packaging the COW assembly 10, a temporary carrier wafer 100 supports and protects the device wafer 104 during processing. More specifically, a second side 136 of the device wafer 104 is attached to the carrier wafer 100 by an adhesive 102. The carrier wafer 100 can be silicon (Si), glass, or other appropriate material. The divider walls 130 and the die stacks 106 are then attached to the device wafer 104. The die stacks 106 can each have several individual semiconductor dies 110. In the embodiment illustrated in FIG. 1A, the die stacks 106 can each include four dies 110 (identified individually as dies 110a-d), but it will be appreciated that the die stacks 106 can have any number of dies (e.g., 2, 3, 4, 5, 6, 7, 8, 10, 12, or more) based on the requirements of the system. The dies 110 can be memory dies, including any known type of memory die.

The device wafer 104 may be a silicon wafer having one or more through-silicon vias (TSVs) 107 extending therethrough to which solder balls, pillars, and pads (not shown)

can be attached at the second surface 136. Accordingly, the device wafer 104 may act as the interposer. In other embodiments, the device wafer 104 itself may have dies, such as logic dies, processors or other types of dies for operating the memory dies 110.

The die stacks 106 may be formed on the device wafer 104 by attaching the die 110a to the device wafer 104, and then serially stacking dies 110b-d on each other to form the die stacks 106 in place on the device wafer 104. Alternatively, the dies 110a-d may be stacked together while apart from the device wafer 104 and then the die stacks 106 are attached to the device wafer 104.

Figure 1B:
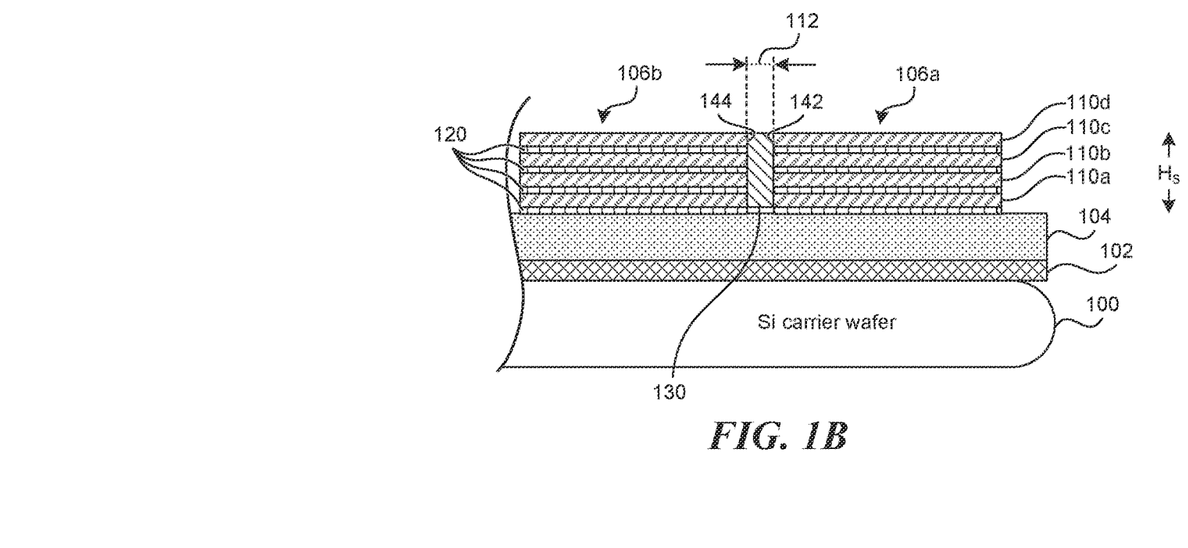
FIG. 1B is a cross-sectional view of two die stacks of the COW assembly of FIG. 1A in accordance with the present technology.

FIG. 1B shows a portion of the COW assembly 10 including the die stacks 106a and 106b in greater detail. The die stacks 106 can have a non-conductive film 120 (NCF) between the die 110a and the device wafer 104 and between each of the dies 110a-d to adhere the dies 110a-d to the device wafer 104 and to each other. The NCF 120 under the die 110a can be the same as or different from the NCF 120 between the dies 110a-110d. Other materials such as an underfill material may be used instead of the NCF 120. The dies 110a-d are also electrically connected to each other and to the device wafer 104 by conductive pillars or bumps (not shown) arranged to correspond to an array of TSVs and/or ball pads between each of the components.

The die stacks 106 are spaced apart from each other by lanes 112 (also indicated on FIG. 1A) defining a lane distance. The width of the lanes 112 may be uniform to accurately separate the die stacks 106 from each other. In another embodiment, the width of some of the lanes 112 may be different with respect to each other.

At this stage of processing the COW assembly 10, the divider walls 130 can occupy the lanes 112 such that one side 142 of the die stack 106a contacts one side of a divider wall 130, forming an integral interface, while one side 144 of an adjacent die stack 106b contacts the other side of the same divider wall 130, forming another integral interface. In some embodiments, the divider walls 130 can be formed after the die stacks 106 have been mounted to the device wafer 104 by dispensing a divider wall material into the lanes 112 between the die stacks 106. For example, the divider walls 130 can be formed in situ on the device wafer 104 using ink jet printing, 3D printing, mask printing or other suitable processes. In other embodiments, the divider walls 130 may be pre-formed as a complete unit or separate wall apart from the device wafer 104. For example, a sheet of the divider wall material may be processed to form a specific pattern of mounting sites with predetermined dimensions. Alternatively, divider wall material may be dispensed into a mold and then dried (cured) to have a desired configuration. A pre-formed divider wall may then be adhered to the device wafer 104 before mounting the die stacks 106 to the device wafer 104. In one embodiment, the divider walls 130 may be glued or adhered to first surface 138 (FIG. 1A) of the device wafer 104 in a single piece or in two or more pieces. In some embodiments, the divider walls 130 may prevent the NCF 120 from extending into the lanes 112 between adjacent die stacks 106.

The divider wall material may be soluble in water or another solvent, or the divider wall material can be carbon based, silicon (Si) or other materials appropriate for dry etch removal. An example of a water-soluble divider wall material is Hogomax. Examples of other solvent dissolvable divider wall materials are Brewer Science Wafer Bond HT-10.10 and Nissan Chemical NAD7009. In yet additional examples, dry etchable divider wall materials can include transparent carbon and polyimide. Materials appropriate for use as divider wall materials are not limited to these examples.

Figure 2:
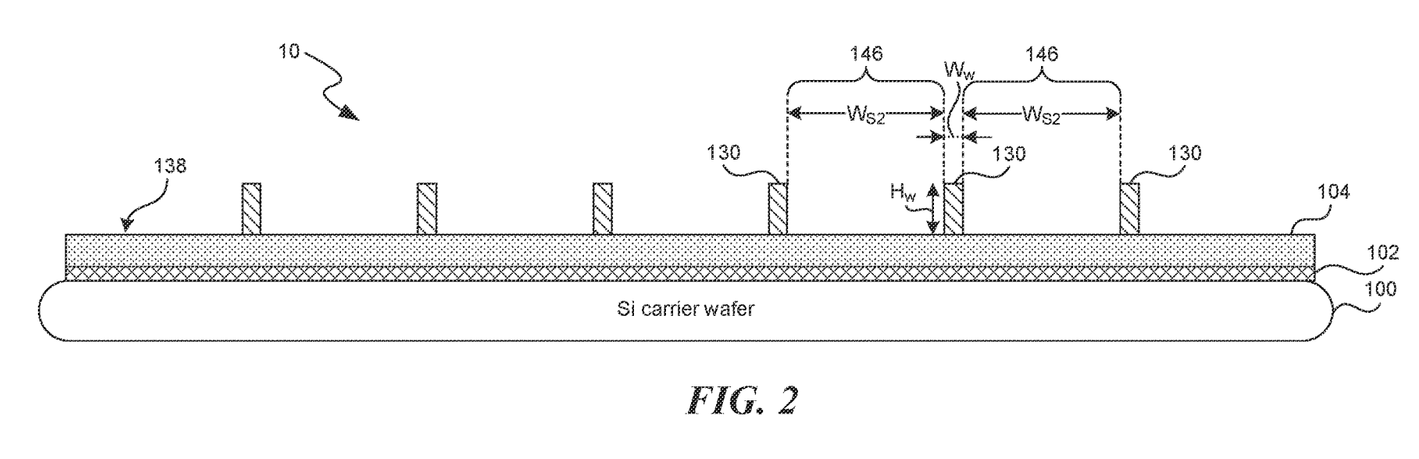
FIG. 2 is a cross-sectional view of a COW assembly after divider walls have been formed on a surface of the device wafer but before die stacks have been placed on the device wafer in accordance with the present technology.
Figure 3:
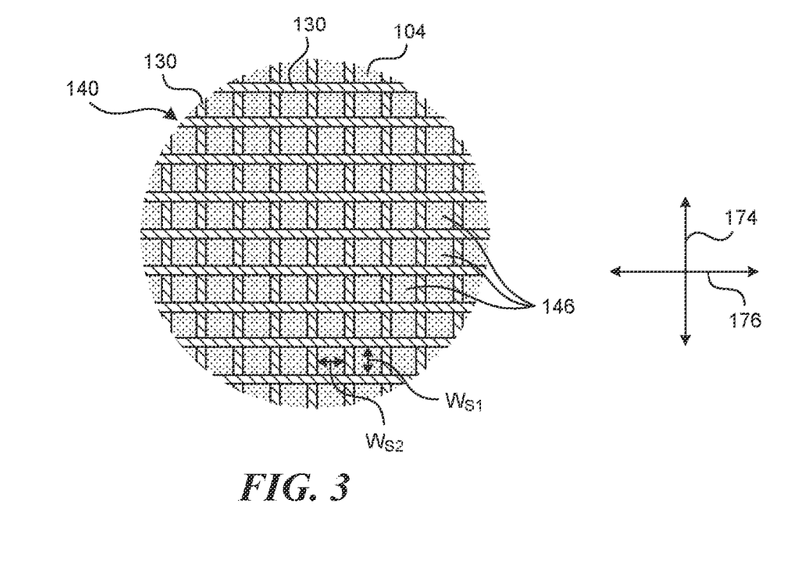
FIG. 3 is a top-down view of divider walls arranged in a grid pattern in accordance with the present technology.

FIG. 2 is a cross-sectional view of the COW assembly 10 at a stage of processing after the divider walls 130 have been formed on the first surface 138 of the device wafer 104, but before die stacks 106 have been placed on the device wafer 104. FIG. 3 is a top-down view of a grid 140 of divider walls 130 in accordance with the present technology. Referring to FIGS. 2 and 3 together, the grid 140 of divider walls 130 define mounting regions 146 having a first dimension $W_{S1}$ (FIG. 3 only) and a second dimension $W_{S2}$ configured to receive the die stacks 106. In general, the mounting regions 146 are configured to receive one or more die stacks 106. The mounting regions 146, for example, can be rectilinear (e.g., square or rectangular) to accommodate the footprint of the die stacks 106.

The grid pattern 140 may be formed of a plurality of intersecting lines configured to reside in the lanes 112 between die stacks 106. In one embodiment, as shown in FIG. 3, substantially parallel lines extending in first direction 174 may intersect substantially parallel lines extending in second direction 176 at 90 degree angles. The divider walls 130 can have a width Ww (see FIG. 2) that may be wide enough to contact the sides of adjacent die stacks 106 as previously discussed. In another embodiment, the width Ww may be less than the width of the lanes 112 (FIG. 1B) between adjacent die stacks 106, leaving a space or gap between the die stacks 106 and the divider walls 130.

The divider walls 130 may have a height $H_w$ (see FIG. 2) that corresponds to the height $H_s$ of the die stacks 106 (FIG. 1). In some embodiments, the divider wall height $H_w$ of the divider walls 130 may be equal to the die stack height $H_s$, while in other embodiments the divider wall height $H_w$ may be less than or greater than the die stack height $H_s$.

In some embodiments, as discussed above, the grid 140 of divider walls 130 can be a pre-formed component that is cut, molded, built by layers or otherwise formed separately to provide the grid pattern 140. The pre-formed grid 140 may be adhered to the device wafer 104 before attaching die stacks 106 to the device wafer 104, or alternatively the pre-formed grid 140 can be attached to the device wafer 104 after some or all of the die stacks 106 are in place. The pre-formed grid 140 may be a single piece or multiple pieces.

Figure 4A:
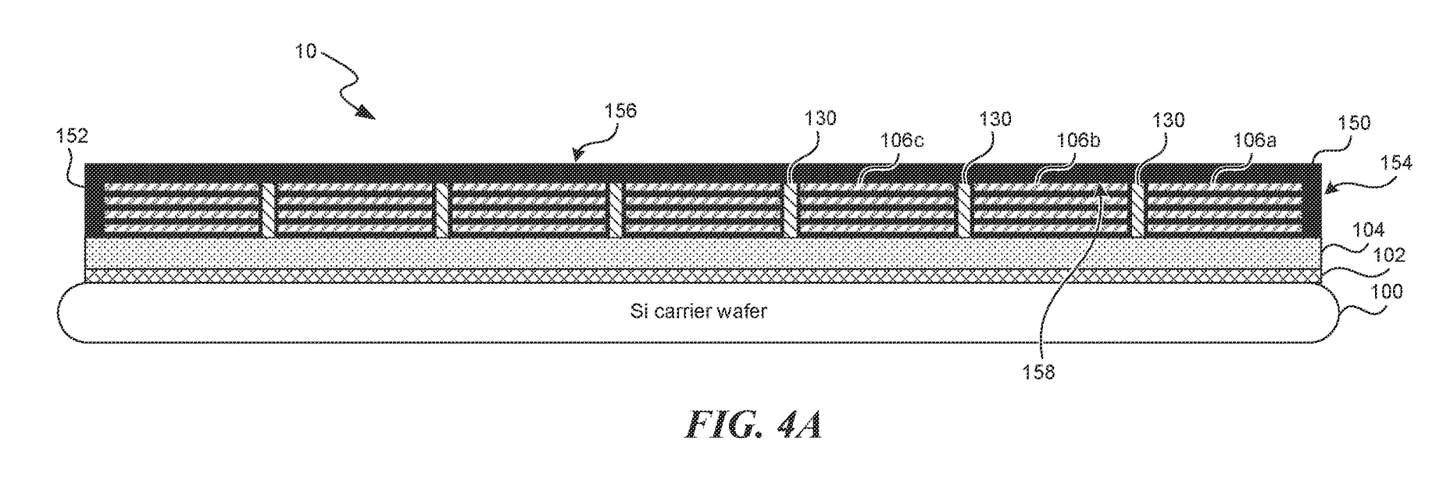
FIG. 4A illustrates a cross-sectional view of an example of an over-molded COW assembly in accordance with the present technology.

FIG. 4A illustrates a cross-sectional view of another example of the over-molded COW assembly 10 in accordance with the present technology after wafer-level molding. Like reference numbers refer to like components in FIGS. 1A-4B. In this example, a molding material 150 is molded over the die stacks 106 and the divider walls 130. The molding material 150 can cover top surface 158 of the die stacks 106 and the top surface of the divider walls 130, as well as the sides of die stacks 106. The molding material 150 can accordingly have outer sides 152 and 154 and a top portion 156.

Figure 4B:
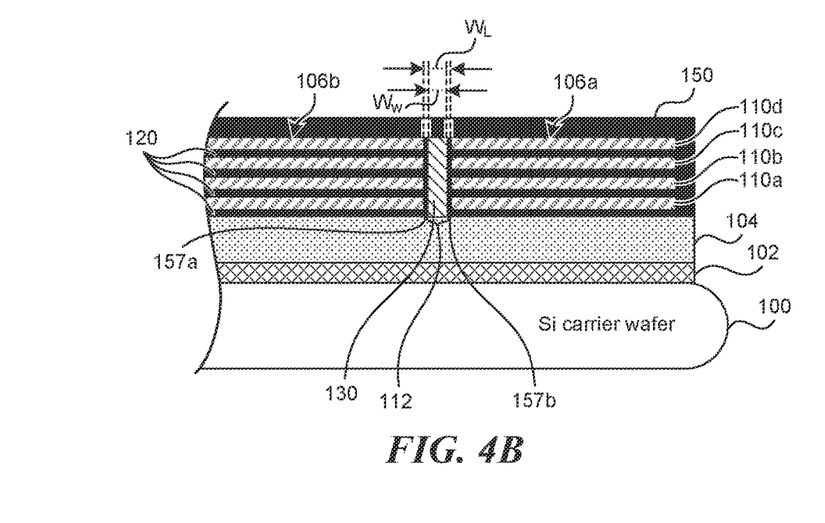
FIG. 4B illustrates a portion of the over-molded COW assembly of FIG. 4A in accordance with the present technology.

As shown in more detail in FIG. 4B, the divider wall width Ww is less than the lane width $W_L$ of the lanes 112 between the die stacks 106 such that there is a gap between the sides of the dies stacks 106 and the divider walls 130. As a result, during the molding process some of the molding material 150 can flow in the gaps between the sides of the die stacks 106 and the divider walls 130 to form side portions 157 (identified individually as 157a and 157b) of the molding material 150.

Figure 5:
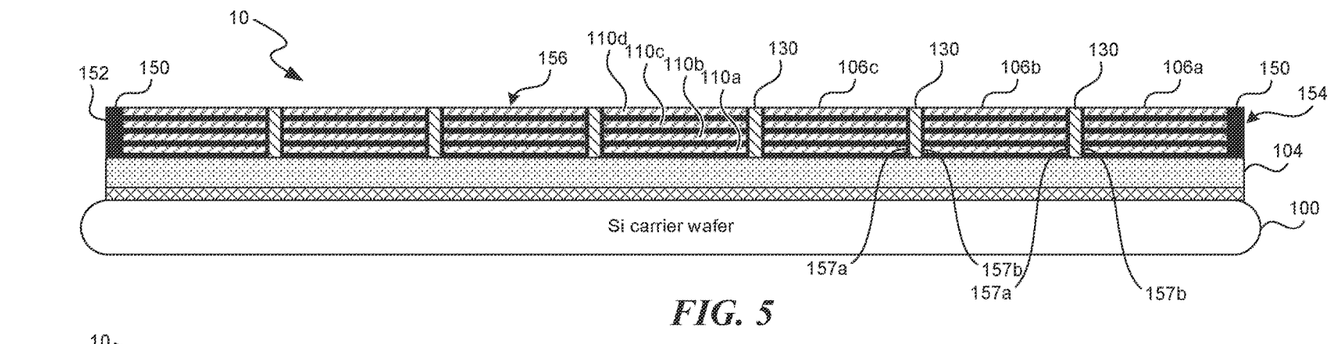
FIG. 5 illustrates a cross-sectional view of an over-molded COW assembly that has a portion of the molding material removed in accordance with the present technology.

FIG. 5 illustrates a cross-sectional view of the over-molded COW assembly 10 after a portion of the molding material 150 has been removed to expose the divider walls 130 in accordance with the present technology. The molding material 150 over the uppermost die 110*d* may be removed while leaving at least portions of the molding material 150 along outer sides 152 and 154. The molding material 150 can be completely removed from the top of the die stacks 106, or a thin layer of molding material 150 can remain on the top of the uppermost die 110*d*. In some embodiments, a small amount of the uppermost die 110*d* may be removed as well. This thinning process may be used to bring the die stacks 106 to a desired thickness or height $H_s$ and to expose the divider walls 130. The molding material 150 can be removed using back-grinding, chemical-mechanical planarization, or other suitable processes. The divider walls 130 between the die stacks 106 can inhibit flexing or bowing of the COW assembly 10 during the over-molding process and as the COW assembly 10 cools after the over-molding process.

Figure 6:
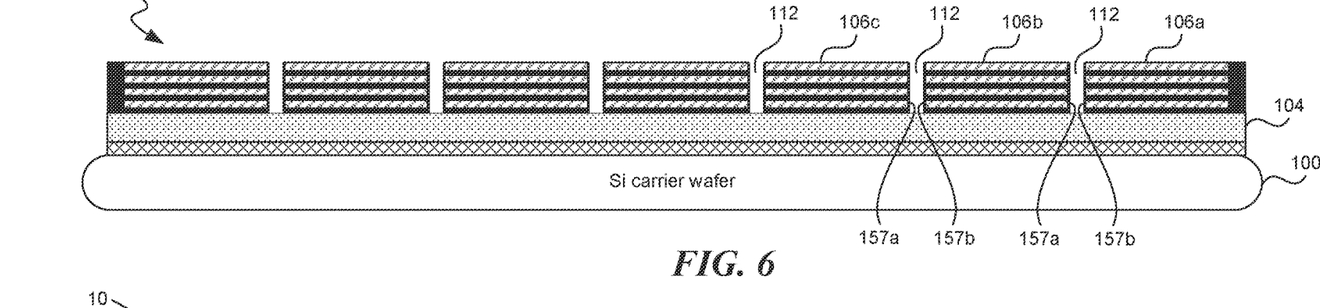
FIG. 6 illustrates a cross-sectional view of a COW assembly wherein the divider walls have been removed in accordance with the present technology.

FIG. 6 illustrates a cross-sectional view of the COW assembly 10 after the divider walls 130 have been removed to open the lanes 112 between the die stacks 106, forming vacant lanes between adjacent die stacks 106. The divider walls 130 can be removed before the COW assembly 10 is attached to a dicing frame and removed from the carrier wafer 100. The divider walls 130 can be removed without sawing or mechanically cutting through the divider wall material. For example, the divider wall material can be dissolved using water or another solvent in a wet process or wet clean. A solvent, for example, can be used to remove a photo-sensitive material or temporary bonding adhesive. In other embodiments, if the divider wall material is an organic carbon-based material, plasma etching may be used to remove the divider wall material. Other materials may be used for the divider wall material, such as a material that may be ablated by a laser. In each of these cases, the divider walls 130 are removed chemically or thermally without a rotary blade or other mechanical cutting device. As a result, the die stacks can be separated into individual units without chipping or cracking the edges of the dies 110.

Figure 7:
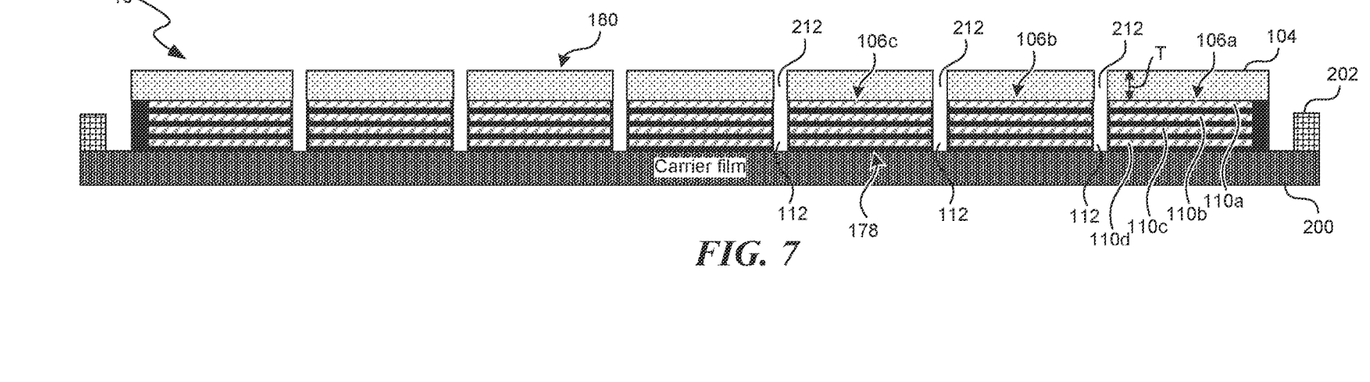
FIG. 7 illustrates a cross-sectional view of the COW assembly inverted from the orientation shown in FIG. 6 after the divider walls and the carrier wafer have been removed in accordance with the present technology.

FIG. 7 illustrates a cross-sectional view of the COW assembly 10 that is inverted from the orientation in FIGS. 5 and 6. At this stage of packaging the COW assembly 10, a tape or carrier film 200 supported by a dicing frame 202 has been attached to the top surface 178 of the die stacks 106 and the carrier wafer 100 has been removed. The device wafer 104 is then cut from the backside 180 (e.g., the upward facing surface in FIG. 7) to form separations 212 that are at least generally aligned with the lanes 112 between die stacks 106. The separations 212 extend through the thickness "T" of the device wafer 104 to fully separate the die stacks 106 from each other. The device wafer 104 can be cut using a laser, rotary saw or other suitable techniques to slice through the thickness T of the device wafer 104 without penetrating into the die 110*a*. Therefore, when cutting the device wafer 104, a blade does not cut alongside the die stacks 106. Because the divider walls 130 have already been removed, there is no need in some embodiments to cut below the thickness T of the device wafer 104. As a result, methods of the present technology are expected to reduce chipping of the dies 110*a-d*.

Figure 8:
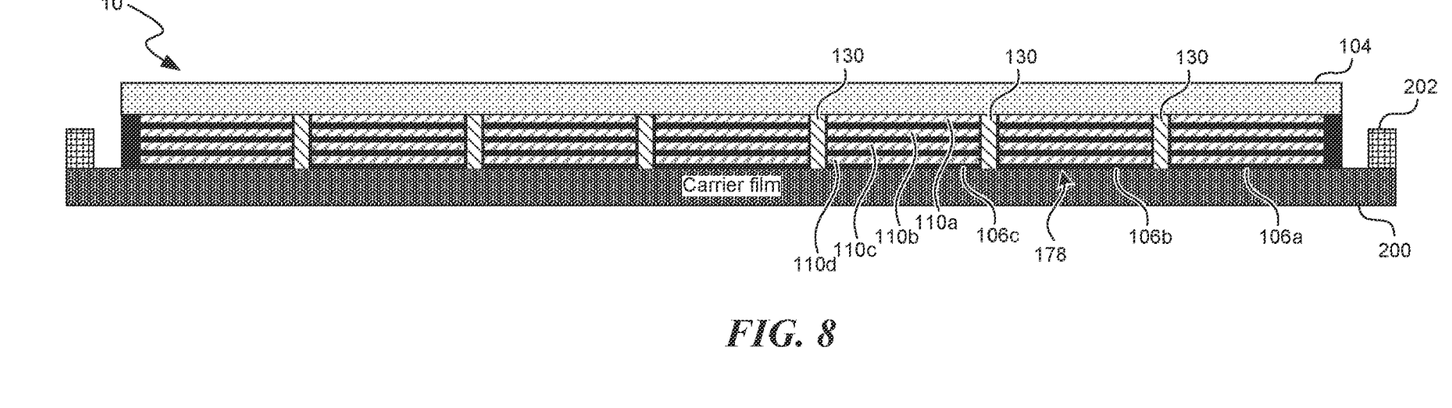
FIG. 8 illustrates a cross-sectional view of the COW assembly inverted from the orientation shown in FIG. 5 that is prepared for dicing in accordance with the present technology.
Figure 9:
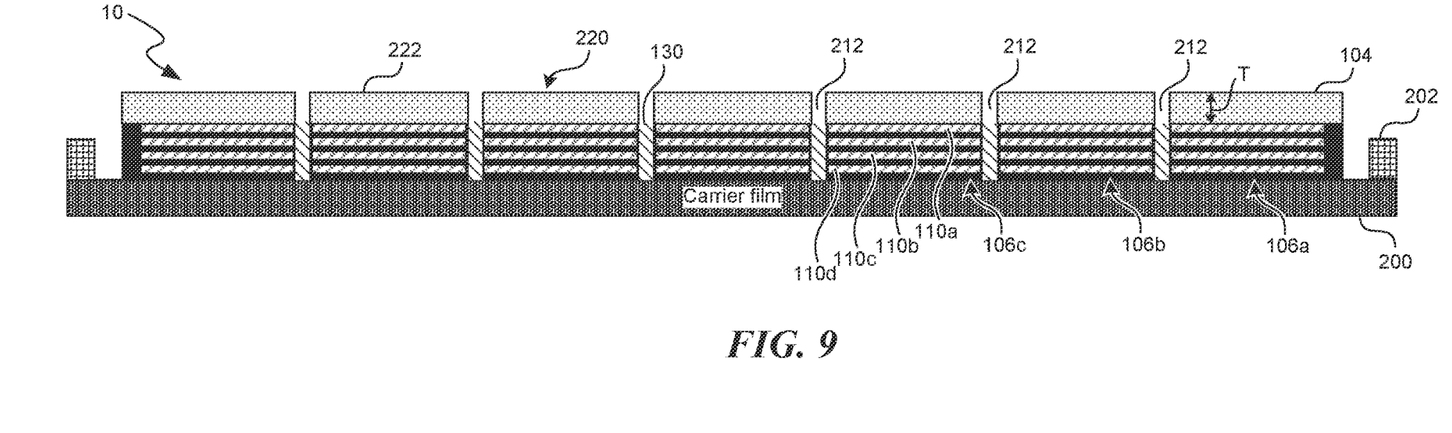
FIG. 9 illustrates the COW assembly of FIG. 8 after the device wafer has been diced from the backside while the divider walls remain in place in accordance with the present technology.

FIGS. 8 and 9 illustrate an alternate embodiment from the stages shown in FIGS. 6 and 7 in which the COW assembly 10 illustrated in FIG. 5 has been attached to the carrier film 200 and the carrier wafer 100 has been removed before the divider walls 130 have been removed. As shown in FIG. 8, the COW assembly 10 is inverted from the orientation shown in FIG. 5 and the divider walls 130 and die stacks 106 contact the carrier film 200. FIG. 9 illustrates the COW assembly 10 after the device wafer 104 has been cut from the backside 220 (e.g., the upward facing surface in FIG. 9) to form separations 212 at least generally aligned with the divider walls 130. The device wafer 104 may be cut as discussed above, such as by using a laser or rotary blade, to cut through only the thickness T of the device wafer 104. After the separations 212 have been formed in the device wafer 104, the divider walls 130 may be removed using a wet process or dry etch to open the lanes 112 between the die stacks 106 (e.g., similar to the lanes 112 shown in FIG. 7). When the divider walls 130 are made from a water soluble material, the wet process will also clean debris from the surface 222 of the device wafer 104 caused by cutting the device wafer 104. Therefore, final cleaning of the COW assembly 10 may be accomplished at the dicing tool. This embodiment provides the advantage of not adding an additional cleaning step.

One expected advantage of the embodiment shown in FIGS. 8 and 9 is that retaining the divider walls 130 until the device wafer 104 has been cut provides additional structural support to the COW assembly 10 to avoid bowing or warping. The additional structural support provided by the divider walls 130 is also expected to prevent or at least inhibit cracking and/or breaking of the device wafer 104 during debonding of the carrier wafer 100. Moreover, the divider walls 130 can also protect the sides of the die stacks 106 from cracking or chipping while the device wafer 104 is being cut.

Figure 10:
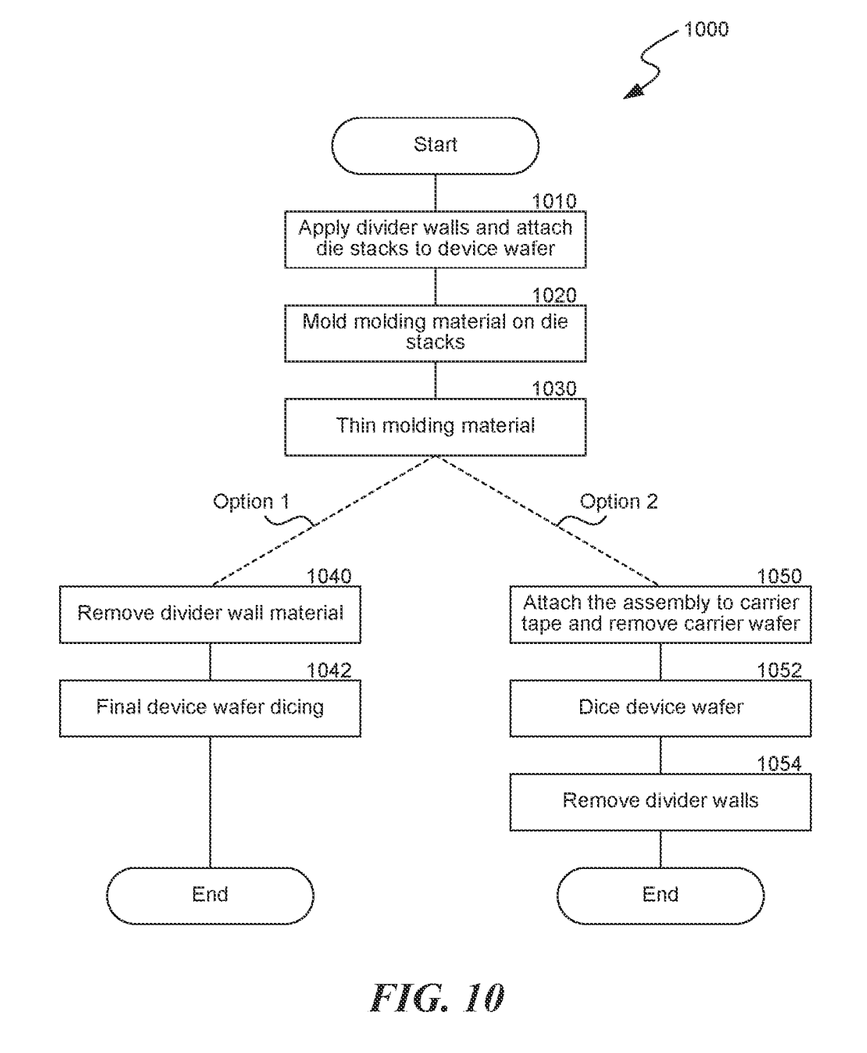
FIG. 10 is a flow chart of methods for separating die stacks of a COW assembly in accordance with the present technology.

FIG. 10 is a flow chart of a method 1000 for processing a COW assembly 10 in accordance with the present technology. The method 1000 includes applying the divider walls 130 and attaching the die stacks 106 to the device wafer 104 (block 1010). The divider walls 130 can be applied to the device wafer 104 either before or after the die stacks 106 are attached to the device wafer 104. A molding material is then molded over the die stacks 106 and the device wafer 104 (block 1020) and the upper portion of the molding material 150 is thinned, such as by back-grinding (block 1030). After thinning the molding material, there are two options. Option 1 includes removing the divider wall material (block 1040) and then dicing the device wafer 104 from the backside (block 1042). Option 2 alternatively includes attaching the COW assembly 10 to the carrier tape 200 and removing the carrier wafer 100 (block 1050), dicing the device wafer 104 from the backside before removing the divider walls 130 (block 1052), and then removing the divider walls 130 (block 1054).

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A chip-on-wafer (COW) assembly, comprising:
a device wafer having a first surface and a second surface that is opposite from the first surface, wherein the device wafer includes separations extending from the first surface to the second surface;
die stacks mounted to the first surface of the device wafer in a pattern, wherein individual die stacks are located at a corresponding mounting site, wherein each of the die stacks comprises at least one semiconductor die;
divider walls forming intersecting lines of the pattern between the die stacks at the first surface of the device wafer, the divider walls comprising divider wall material that is a water-soluble material or a solvent dissolvable material, wherein each of the divider walls is at least partially vertically aligned with a respective one of the separations; and
a molding material formed over and encasing the die stacks at the first surface of the device wafer.

2. The COW assembly of claim 1 wherein the die stacks have sides facing the divider walls, and wherein at least one side of at least one of the die stacks forms an integral interface with the divider wall material.

3. The COW assembly of claim 1 wherein the divider wall material is pre-formed into the intersecting lines of the pattern prior to being adhered to the first surface of the device wafer.

4. The COW assembly of claim 1 wherein the divider wall material is dispensed between the die stacks after the die stacks are mounted to the first surface.

5. The COW assembly of claim 1 wherein the device wafer further includes separations extending from the second surface to the first surface and vertically aligned with the divider walls.

6. The COW assembly of claim 5 wherein the separations split the device wafer having individual portions each corresponding to one of the individual die stacks.

7. The COW assembly of claim 1 wherein the die stacks include an inner surface mounted to the first surface of the device wafer and an outer surface opposite the inner surface, and wherein the COW assembly further comprises a carrier film formed over the outer surface.

8. A semiconductor assembly, comprising:
a device wafer having a first surface and a second surface that is opposite from the first surface, wherein the device wafer includes a plurality of trenches arranged in a first grid array, each of the plurality of trenches extending from the second surface to the first surface;
divider walls arranged in a second grid array vertically offset from the first surface of the device wafer, the second grid array defining a plurality of mounting regions in openings in the second grid array, wherein the divider walls comprise a water-soluble divider wall material or a solvent dissolvable divider wall material;
a plurality of die stacks coupled to the first surface of the device wafer, wherein each individual die stack of the plurality of die stacks is positioned in one of the plurality of mounting regions in the second grid array; and
a molding compound formed around the divider walls and each of the plurality of die stacks.

9. The semiconductor assembly of claim 8 wherein the divider walls are aligned with dicing lanes in the device wafer.

10. The semiconductor assembly of claim 9 wherein the device wafer further includes separations extending from the second surface to the first surface in each of the dicing lanes.

11. The semiconductor assembly of claim 9 wherein each of the dicing lanes has a first width, and wherein each of the divider walls has a second width less than the first width.

12. The semiconductor assembly of claim 9 wherein each of the dicing lanes has a first width, wherein each of the divider walls has a second width equal to the first width, and wherein each of the divider walls has side surfaces in contact with individual die stacks positioned in adjacent mounting regions in the second grid array.

13. The semiconductor assembly of claim 8 wherein each individual die stack of the plurality of die stacks includes a top surface, and wherein the semiconductor assembly further comprises a carrier film attached to the top surface of each die stack.

14. The semiconductor assembly of claim 8 wherein the divider walls have a first height, and wherein each individual die stack of the plurality of die stacks has a second height equal to the first height.

* * * * *